United States Patent
Shoyama

(10) Patent No.: US 8,982,254 B2
(45) Date of Patent: Mar. 17, 2015

(54) SOLID-STATE IMAGE SENSOR AND MANUFACTURING METHOD THEREOF, AND CAMERA

(71) Applicant: Canon Kabushiki Kaisha, Tokyo (JP)

(72) Inventor: Toshihiro Shoyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/625,663

(22) Filed: Sep. 24, 2012

(65) Prior Publication Data

US 2013/0088626 A1 Apr. 11, 2013

(30) Foreign Application Priority Data

Oct. 6, 2011 (JP) ................................. 2011-222348

(51) Int. Cl.
*H04N 3/14* (2006.01)
*H04N 5/335* (2011.01)
*H01L 27/146* (2006.01)
*H01L 31/103* (2006.01)

(52) U.S. Cl.
CPC .... *H01L 27/14629* (2013.01); *H01L 27/14627* (2013.01); *H01L 27/14687* (2013.01); *H01L 31/103* (2013.01)
USPC ........... 348/294; 348/298; 348/302; 348/308; 348/312

(58) Field of Classification Search
CPC .......... H04N 2201/02487; H04N 2201/02406; H04N 2201/02452
USPC .................. 438/724.744, 757, 769, 786, 791; 348/294, 302, 311, 312
See application file for complete search history.

(56) References Cited

U.S. PATENT DOCUMENTS

| 7,001,844 | B2 | 2/2006 | Chakravarti et al. | |
|---|---|---|---|---|
| 7,157,340 | B2 | 1/2007 | Ito et al. | |
| 7,442,973 | B2 | 10/2008 | Komoguchi et al. | |
| 7,842,986 | B2 | 11/2010 | Komoguchi et al. | |
| 2006/0040497 | A1 | 2/2006 | Chakravarti et al. | |
| 2007/0108546 | A1* | 5/2007 | Furuichi | 257/462 |
| 2007/0278536 | A1* | 12/2007 | Adachi | 257/239 |
| 2008/0007839 | A1* | 1/2008 | Deng et al. | 359/642 |
| 2008/0203541 | A1 | 8/2008 | Makiyama | |
| 2014/0045345 | A1* | 2/2014 | Makiyama | 438/792 |

FOREIGN PATENT DOCUMENTS

| CN | 1722433 A | 1/2006 |
|---|---|---|
| JP | 2003-197939 A | 7/2003 |
| JP | 2004-207433 A | 7/2004 |
| JP | 2005-260203 A | 9/2005 |
| JP | 2005-317980 A | 11/2005 |

OTHER PUBLICATIONS

First Office Action in Chinese Application No. 201210375335.2 (issued Dec. 1, 2014).

* cited by examiner

*Primary Examiner* — Yogesh Aggarwal
(74) *Attorney, Agent, or Firm* — Fitzpatrick, Cella, Harper & Scinto

(57) ABSTRACT

A method of manufacturing a solid-state image sensor having a photoelectric conversion portion includes forming a silicon nitride film by a low-pressure chemical vapor deposition method using hexachlorodisilane ($Si_2Cl_6$) as a material gas such that the silicon nitride film covers at least a part of the photoelectric conversion portion.

21 Claims, 15 Drawing Sheets

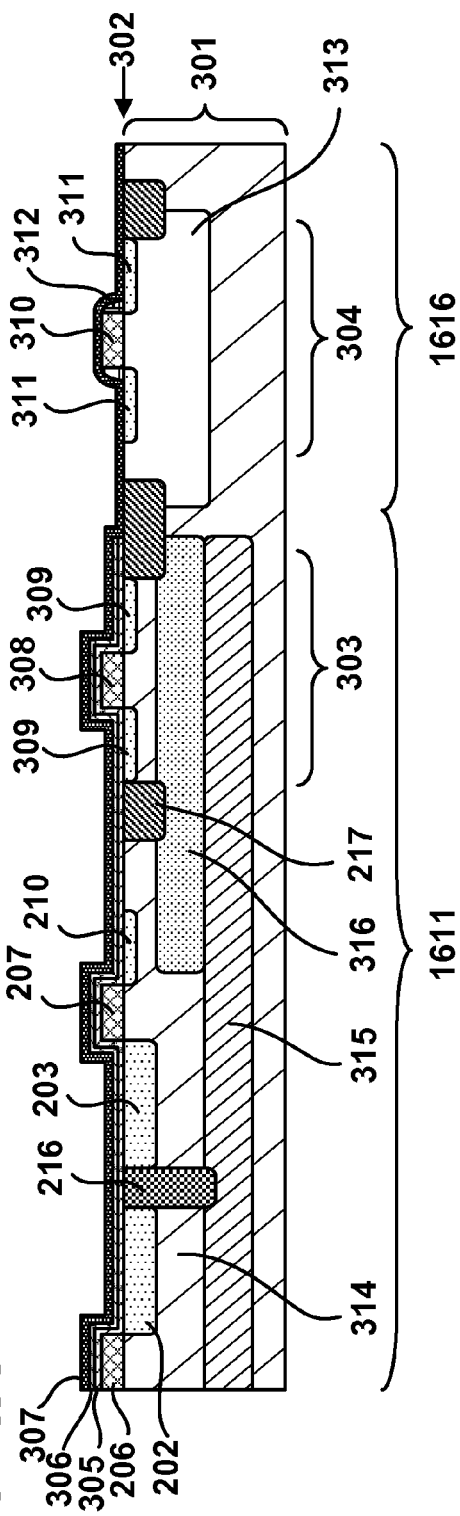
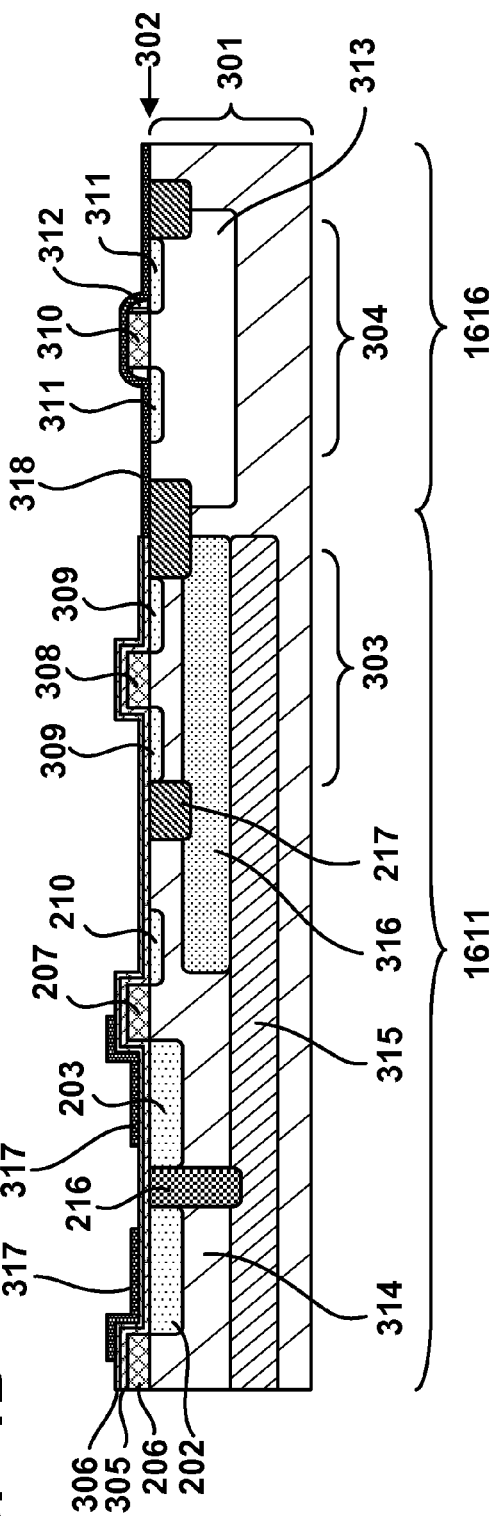

SOLID-STATE IMAGE SENSOR AND MANUFACTURING METHOD THEREOF, AND CAMERA

BACKGROUND OF THE INVENTION

1. Field of the Invention

The present invention relates to a solid-state image sensor and manufacturing method thereof, and a camera.

2. Description of the Related Art

In recent years, a solid-state image sensor having lightguides for increasing light to be incident on photoelectric conversion portions has been proposed. As described in Japanese Patent Laid-Open No. 2004-207433, a silicon nitride film is formed on a semiconductor substrate, on which photodiodes are formed, by a low-pressure CVD (Chemical Vapor Deposition) method, an interlayer insulation film is formed on the silicon nitride film, and the interlayer insulation film is etched using the silicon nitride film as an etching stopper. Opening portions required to form lightguides are formed by etching the interlayer insulation film. Furthermore, by etching the silicon nitride film via the opening portions, opening portions are also formed in the silicon nitride film. Also, as described in Japanese Patent Laid-Open No. 2004-207433, since the silicon nitride film as the etching stopper has a high hydrogen absorption effect, hydrogen can be prevented from entering a portion covered by the silicon nitride film (paragraphs 0019 to 0021, 0030, and 0031). Furthermore, Japanese Patent Laid-Open No. 2004-207433 describes a structure in which a partial region (a surrounding region of each lightguide) of the upper face of each photodiode is covered by the silicon nitride film via a gate insulation film (paragraph 0021, FIG. 3(B)).

The silicon nitride film described in Japanese Patent Laid-Open No. 2004-207433 functions to prevent hydrogen from entering a portion covered by that film. Hence, it is understood that the silicon nitride film is a film having a small hydrogen content, that is, a silicon nitride film (to be referred to as DCS-SiN hereinafter) formed by the low-pressure CVD method using dichlorosilane ($SiH_2Cl_2$: to be referred to as DCS hereinafter). When a pixel is covered by the DCS-SiN, hydrogen supply to each photoelectric conversion portion becomes insufficient, and dangling bonds cannot be sufficiently terminated. Hence, it is difficult to obtain a solid-state image sensor with a low dark current.

On the other hand, a method of forming a silicon nitride film (to be referred to as P—SiN hereinafter) on each photoelectric conversion portion by a plasma-enhanced CVD (PECVD) method so as to increase a hydrogen supply amount to the photoelectric conversion portion has been proposed. However, with this method, since a substrate suffers plasma damages at the time of formation of the P—SiN, a structure which covers pixels by the P—SiN may increase crystal defects of photoelectric conversion portions. Hence, this method is disadvantageous to obtain a solid-state image sensor with a low dark current.

SUMMARY OF THE INVENTION

The present invention provides a technique which is advantageous to reduce a dark current of a solid-state image sensor.

One of aspects of the present invention provides a method of manufacturing a solid-state image sensor having a photoelectric conversion portion, the method comprising: forming a silicon nitride film by a low-pressure chemical vapor deposition method using hexachlorodisilane ($Si_2Cl_6$) as a material gas such that the silicon nitride film covers at least a part of the photoelectric conversion portion.

Further features of the present invention will become apparent from the following description of exemplary embodiments with reference to the attached drawings.

BRIEF DESCRIPTION OF THE DRAWINGS

FIGS. 1A to 1C are views for explaining a solid-state image sensor according to the first embodiment of the present invention and a manufacturing method thereof;

DESCRIPTION OF THE EMBODIMENTS

Figure 1C:
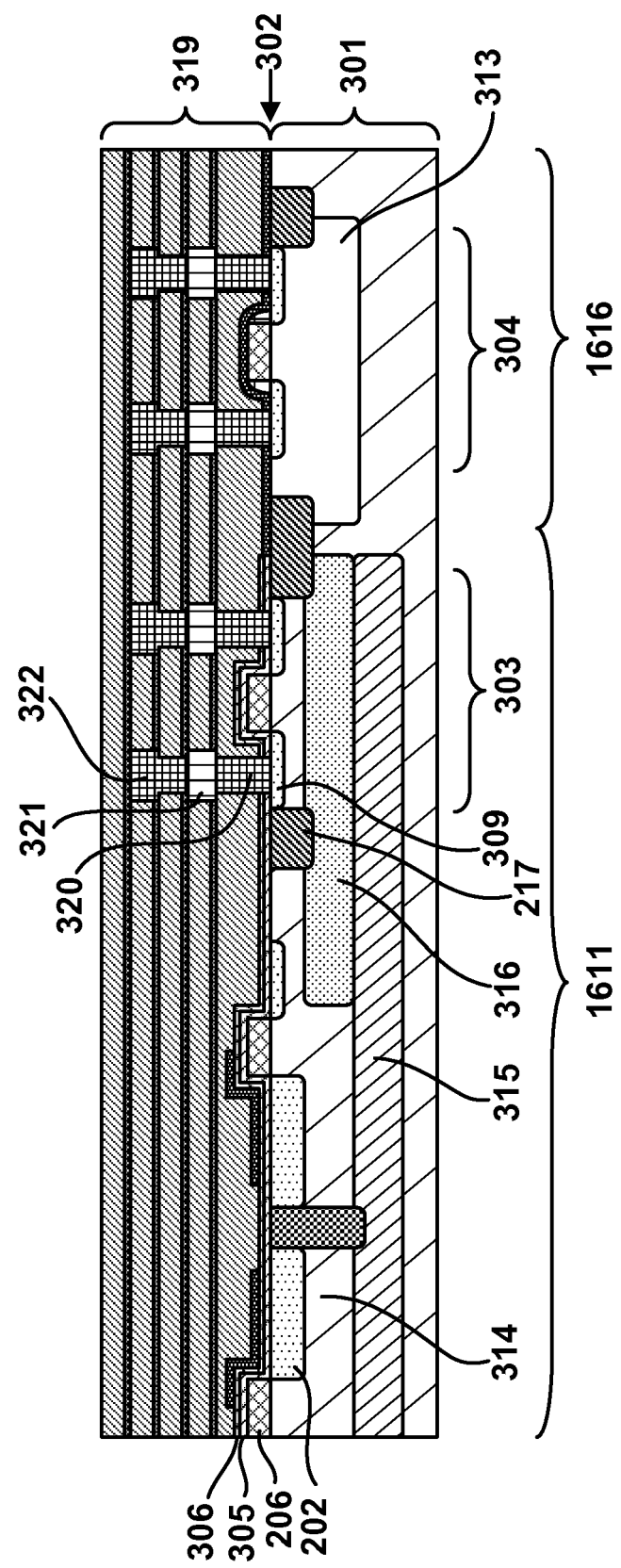

Embodiments of the present invention will be described hereinafter. One embodiment of the present invention is directed to a manufacturing method of a solid-state image sensor having photoelectric conversion portions. The manufacturing method includes a process for forming a silicon nitride film by a low-pressure CVD (LPCVD) method using hexachlorodisilane ($Si_2Cl_6$: HCD) as a material gas, so as to cover at least a part of each photoelectric conversion portion. In this case, a film such as an insulation film may or may not be formed between the photoelectric conversion portion and the silicon nitride film. The silicon nitride film may cover the entire region of the photoelectric conversion portion. According to this embodiment, since the silicon nitride film with excellent hydrogen supply performance to the photoelectric conversion portion is formed, dangling bonds of the photoelectric conversion portion are terminated by hydrogen, thus reducing a dark current. Also, this embodiment is advantageous to reduce a dark current since no plasma damages are given to the photoelectric conversion portion unlike in a case in which a silicon nitride film is formed by the plasma-enhanced CVD method.

On the other hand, when DCS is used as a material gas required to supply silicon upon formation of a silicon nitride film which covers at least a part of each photoelectric conversion portion, the hydrogen content of the obtained silicon nitride film is extremely small. For this reason, for example, at the time of a sintering process in a hydrogen atmosphere, a hydrogen supply amount to the photoelectric conversion portion covered by this silicon nitride film becomes small. As a result, dangling bonds cannot be sufficiently terminated, and it is difficult to obtain a solid-state image sensor with a low dark current.

More practical embodiments of the present invention will be described hereinafter, but the present invention is not limited to the following embodiments. For example, a solid-state image sensor of each of the following embodiments has lightguides, but the lightguides may be arbitrarily adopted. The solid-state image sensor of each of the following embodiments is a front-side illumination sensor, but the present invention is applicable to a back-side illumination sensor.

A solid-state image sensor according to the first embodiment of the present invention and a manufacturing method thereof will be described below with reference to FIGS. 1A to 1C, FIGS. 2A to 2C, and FIGS. 3A and 3B. A solid-state image sensor of the first embodiment includes a pixel portion 1611 and a peripheral circuit portion 1616. The pixel portion 1611 typically includes a plurality of pixels, and each pixel includes one photoelectric conversion portion. The peripheral circuit portion 1616 is a region other than the pixel portion 1611. The peripheral circuit portion 1616 can include, for example, a vertical scanning circuit (row selecting circuit), horizontal scanning circuit (column selecting circuit), readout circuit, and control circuit. FIGS. 1A to 1C, FIGS. 2A to 2C, and FIGS. 3A and 3B illustrate the pixel portion 1611 including two photoelectric conversion portions and the peripheral circuit portion 1616 including one transistor 304. However, the pixel portion 1611 includes more photoelectric conversion portions, and the peripheral circuit portion 1616 includes more transistors.

A manufacturing method of the solid-state image sensor according to the first embodiment will be described below. In a process shown in FIG. 1A, a semiconductor substrate 301 on which elements such as transistors and photoelectric conversion portions are formed is prepared, and a silicon nitride film 305, silicon oxide film 306, and silicon nitride film 307 are formed as insulation films on a principal face 302 of the semiconductor substrate 301. The semiconductor substrate 301 is typically a silicon substrate, and has the principal face 302. The semiconductor substrate 301 includes n-type semiconductor regions 202 and 203 which respectively configure photoelectric conversion portions (photodiodes), a transistor 303 of the pixel portion 1611, and the transistor 304 of the peripheral circuit portion 1616. The n-type semiconductor regions 202 and 203 function as charge accumulation regions which accumulate charges (electrons in this example). Gate electrodes 206 and 207 of transfer transistors respectively correspond to the n-type semiconductor regions 202 and 203, and have a function of transferring charges in the n-type semiconductor regions 202 and 203.

An n-type semiconductor region 314 is formed below the n-type semiconductor regions 202 and 203 as the charge accumulation regions. The n-type semiconductor region 314 has a lower impurity concentration than the n-type semiconductor regions 202 and 203 as the charge accumulation regions. Below the n-type semiconductor region 314, a p-type semiconductor region 315 is located. At least the n-type semiconductor regions 202 and 314 and p-type semiconductor region 315 configure one photoelectric conversion portion. Also, at least the n-type semiconductor regions 203 and 314 and p-type semiconductor region 315 configure one photoelectric conversion portion. The n-type semiconductor regions 202 and 203 are isolated from each other by an isolation portion 216.

The transistor 303 of the pixel portion 1611 has n-type source/drain regions 309 and a gate electrode 308. A p-type semiconductor region 316 is located below the source/drain regions 309 of the transistor 303 and a floating diffusion 210. In the peripheral circuit portion 1616, an NMOS transistor and PMOS transistor which configure a CMOS circuit are located. However, FIGS. 1A to 1C, FIGS. 2A to 2C, and FIGS. 3A and 3B exemplify only the NMOS transistor. The transistor 304 of the peripheral circuit portion 1616 has n-type source/drain regions 311 located in a p-type semiconductor region 313, and a gate electrode 310 which is located on the principal face 302 of the semiconductor substrate 301 between the source/drain regions 311. Note that in FIGS. 1A to 3B, a gate insulation film is not shown. The transistors such as the transistors 303 and 313 are isolated from each other by element isolation portions 317.

In the process shown in FIG. 1A, a plurality of stacked insulation films are formed on the principal face 302 of the semiconductor substrate 301 on both regions of the pixel portion 1611 and peripheral circuit portion 1616. More specifically, a silicon oxide film (not shown) is formed on the principal face 302, the silicon nitride film 305 is formed on the silicon oxide film, and the silicon oxide film 306 is formed on the silicon nitride film 305. As for the peripheral circuit portion 1616 of the pixel portion 1611 and peripheral circuit portion 1616, the silicon oxide film (not shown), silicon nitride film 305, and silicon oxide film 306 are etched to form side spacers 312 on side walls of the gate electrode 310. Using these side spacers 312, the source/drain regions 311 can be formed to have an LDD structure. The silicon nitride film 305 which remains on the pixel portion 1611 can be used as an etching stopper upon formation of contact holes, and can also be used as an antireflection film.

A silicide layer of a high melting point metal such as cobalt silicide can be formed on the source/drain regions 311 and gate electrode 310. This silicide layer can be selectively formed only on the transistor of the peripheral circuit portion 1616. This is to reduce electrical resistances of the source/drain regions 311 and gate electrode 310. Note that the silicide layer may be formed on one of the source/drain regions 311 and gate electrode 310.

A silicon nitride film (insulation film) 307 can be formed on both the regions of the pixel portion 1611 and peripheral circuit portion 1616. Before formation of the silicon nitride film 307, a silicon oxide film (not shown) may be formed on both the pixel portion 1611 and peripheral circuit portion 1616. This is to prevent the principal face 302 of the semiconductor substrate from exposing from the source/drain regions 311 of the transistor 304 of the peripheral circuit portion 1616.

Next, in a process shown in FIG. 1B, the silicon nitride film 307 formed on the pixel portion 1611 and peripheral circuit portion 1616 is patterned to form silicon nitride films 317 and a silicon nitride film 318. In this case, when the silicon oxide film (not shown) is formed, it may be patterned to have the same shapes as the silicon nitride films 317 and 318. The silicon nitride films 317 can be located on the n-type semiconductor regions 202 and 203 as the charge accumulation regions, that is, to cover at least portions of the photoelectric conversion portions and at least a portion of the gate electrode 207 of the transfer transistor. On other regions of the pixel portion 1611, the silicon nitride film 307 is removed by etching. On the peripheral circuit portion 1616, the silicon nitride film 307 is left as the silicon nitride film 318 without being etched.

Next, in a process shown in FIG. 1C, a plurality of interlayer insulation films 319, contact plugs 320, first wiring layers 321, and second wiring layers 322 including a via plug can be formed. The plurality of interlayer insulation films 319 can be configured by alternately stacking silicon oxide films and silicon nitride films. The plurality of interlayer insulation films 319 can be used as claddings of lightguides. The first and second wiring layers 321 and 322 can be formed by a damascene method using, for example, a material containing copper as a principal component, but they may be formed using other materials such as aluminum.

Figure 2A:
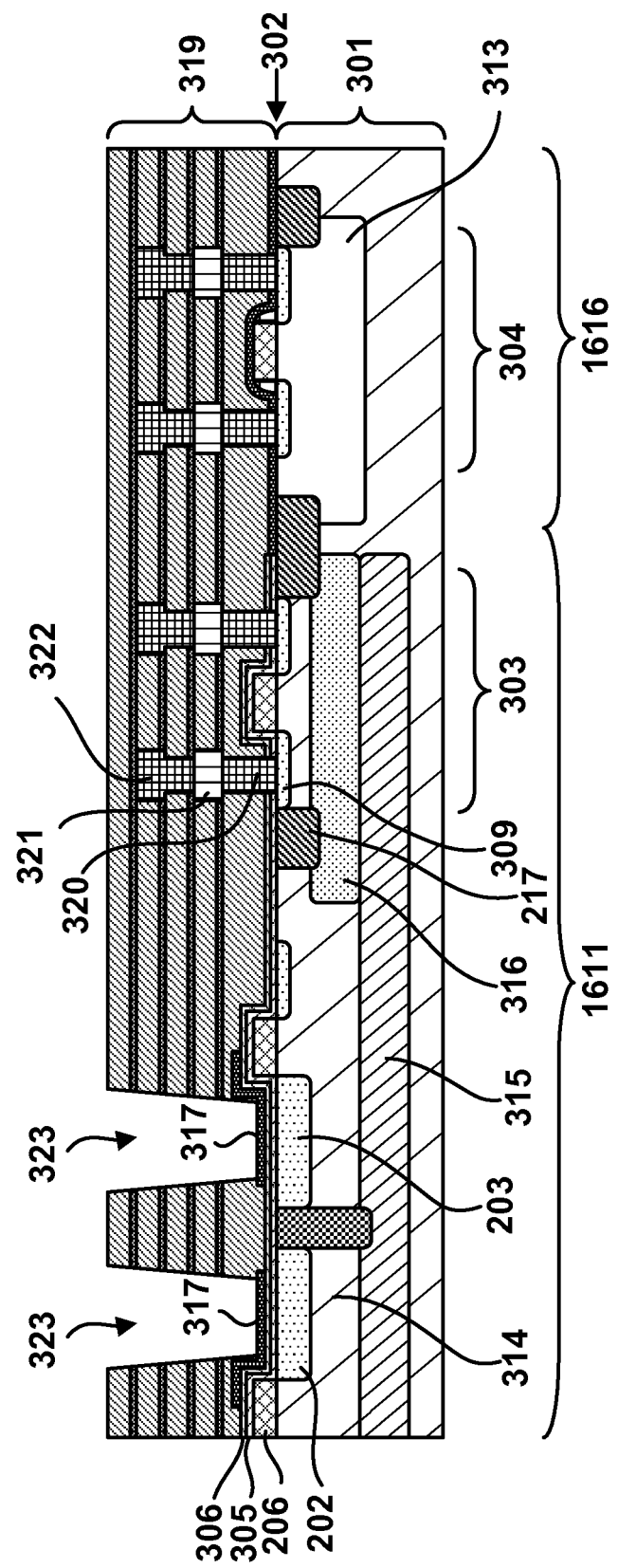
FIGS. 2A to 2C are views for explaining the solid-state image sensor according to the first embodiment of the present invention and the manufacturing method thereof.

Next, in a process shown in FIG. 2A, openings 323 are formed in the plurality of interlayer insulation films 319. The openings 323 can be formed by forming a photoresist pattern (not shown) having openings in regions corresponding to the photoelectric conversion portions (n-type semiconductor regions 202 and 203), and etching the plurality of interlayer insulation films 319 using that pattern as a mask. This etching can be, for example, anisotropic etching. More specifically, plasma etching can be executed for the plurality of interlayer insulation films 319 until the silicon nitride films 317 are exposed. The silicon nitride films 317 are films required to reduce plasma damages on the photoelectric conversion portions (n-type semiconductor regions 202 and 203) at the time of etching, and also function as etching stop films. The aforementioned silicon oxide film (not shown), silicon nitride film 305, and silicon oxide film 306, which are located between the principal face 302 of the semiconductor substrate and the silicon nitride films 317, can function as antireflection films with respect to light which becomes incident on the photoelectric conversion portions (n-type semiconductor regions 202 and 203).

Figure 2B:
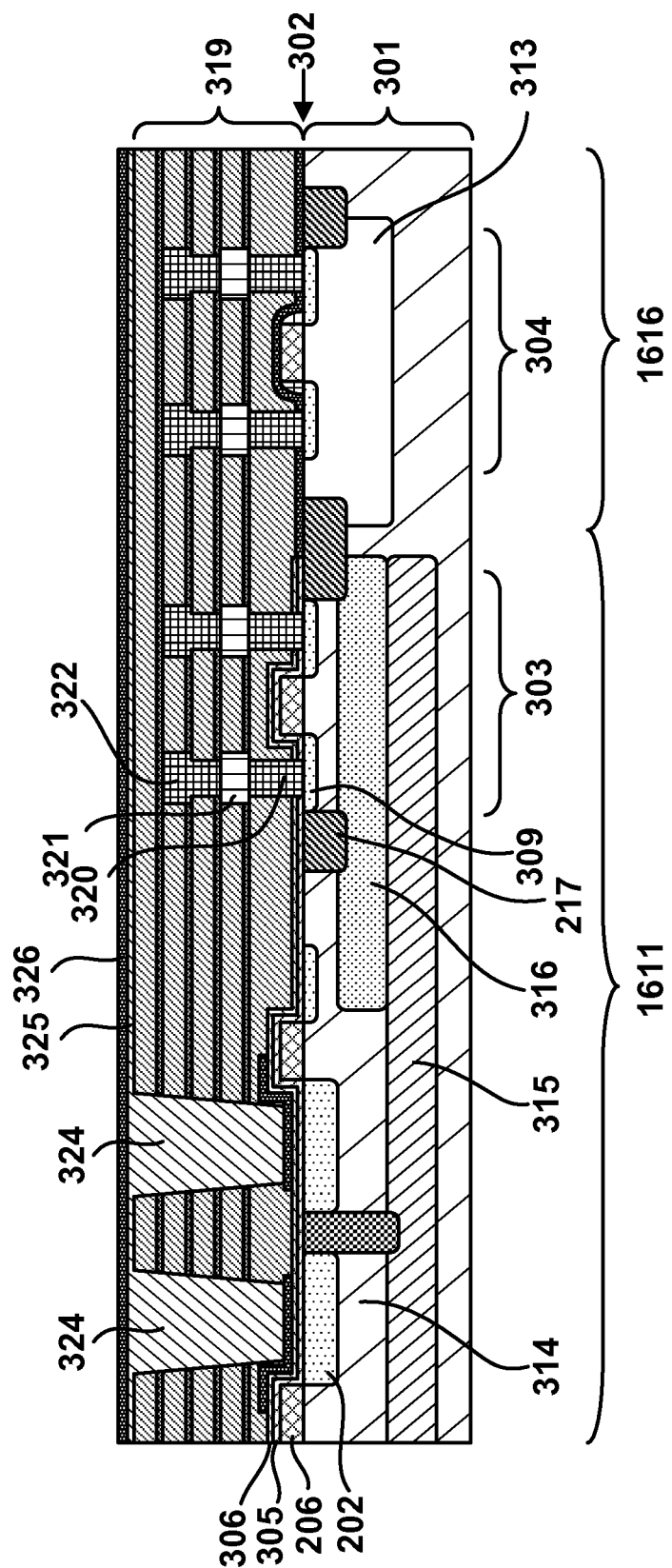

Next, in a process shown in FIG. 2B, a transparent material having a higher refractive index than the plurality of interlayer insulation films 319 serving as claddings fills the openings 323 to form portions used as cores of lightguides used to guide light to the photoelectric conversion portions. In this case, silicon nitride having a higher refractive index than silicon oxide as a principal material of the plurality of interlayer insulation films 319 is formed in the openings 323. More specifically, silicon nitride is deposited on the entire face by a High Density Plasma-CVD method (to be referred to as HDP-CVD method hereinafter), thereby filling the openings 323 with silicon nitride 324. The silicon nitride formed on a portion other than the openings 323 can be removed by, for example, Chemical Mechanical Polishing (to be abbreviated as CMP hereinafter) or plasma etching. This process flattens the face of the silicon nitride, thus forming a silicon nitride film 325. Each lightguide can be configured by the plurality of interlayer insulation films 319 and the silicon nitride 324 as a high refractive index material. A silicon oxynitride film (insulation film) 326 can be formed on the upper face of the silicon nitride film 325.

Figure 2C:
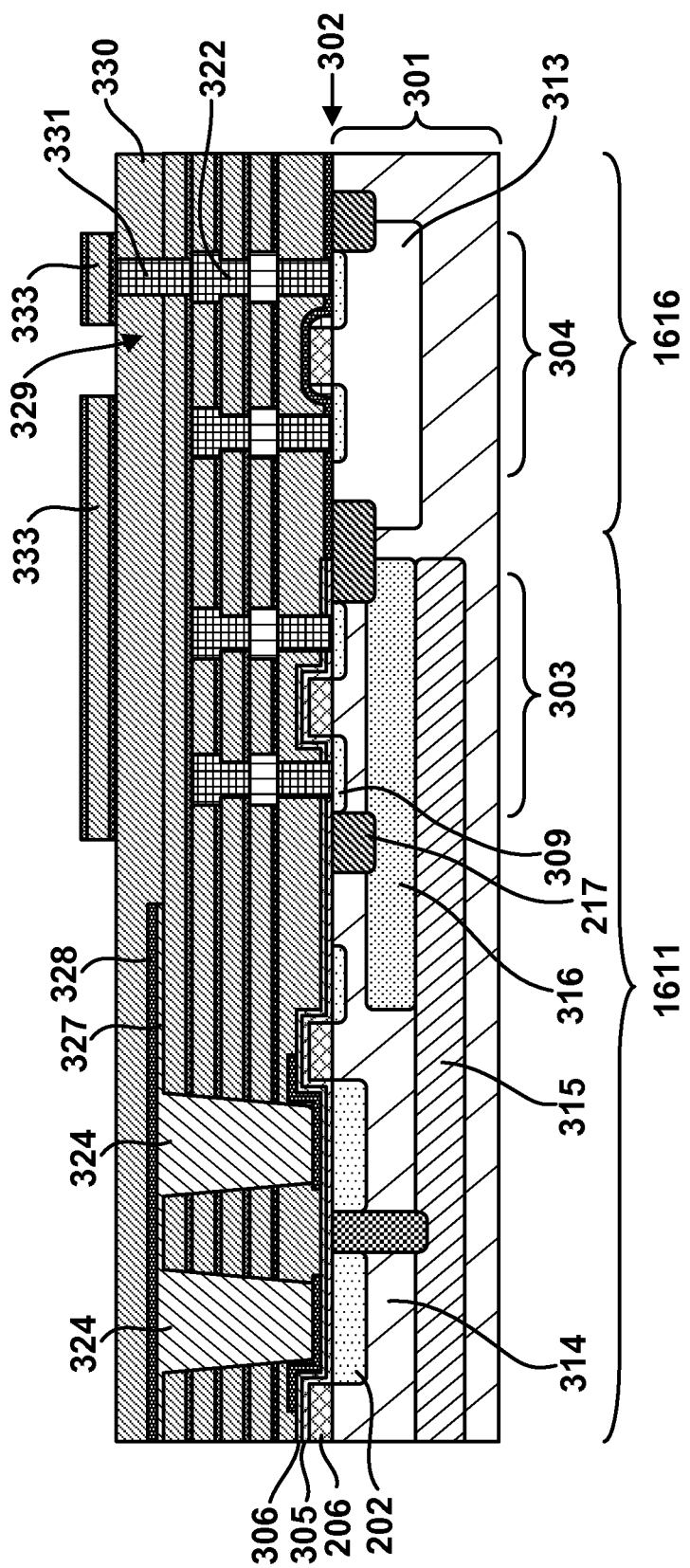

Next, in a process shown in FIG. 2C, the silicon nitride film 325 and silicon oxynitride film 326 are patterned. In the example shown in FIG. 2C, the silicon nitride film 325 and silicon oxynitride film 326 on the peripheral circuit portion 1616 are removed. However, at least a prospective formation region of a via plug 331 of the entire region of the silicon nitride film 325 and silicon oxynitride film 326 need only be removed. Also, the silicon nitride film 325 and silicon oxynitride film 326 may be left on the prospective formation region of the via plug 331. The silicon nitride film 325 and silicon oxynitride film 326 are patterned by anisotropic etching, for example, plasma etching. With this process, the silicon nitride film 325 and silicon oxynitride film 326 are patterned into a silicon nitride film 327 and silicon oxynitride film 328 having an opening 329. After that, an insulation film 330 is formed to fill the opening 329 and to cover the silicon nitride film 327 and silicon oxynitride film 328. The insulation film 330 can be configured by, for example, silicon oxide. The insulation film 330 can be formed by, for example, a plasma-enhanced CVD method. Next, the via plug 331 which connects the insulation film 330 and the second wiring layer 322 is formed. The via plug 331 is configured by, for example, tungsten, and can have a barrier metal of titanium and titanium nitride.

Third wiring layers 333 can then be formed above the via plug 331. The third wiring layers 333 can be configured by, for example, a conductor containing aluminum as a principal component. In this case, the third wiring layers 333 can also function as light-shielding films of a peripheral circuit region.

Figure 3A:
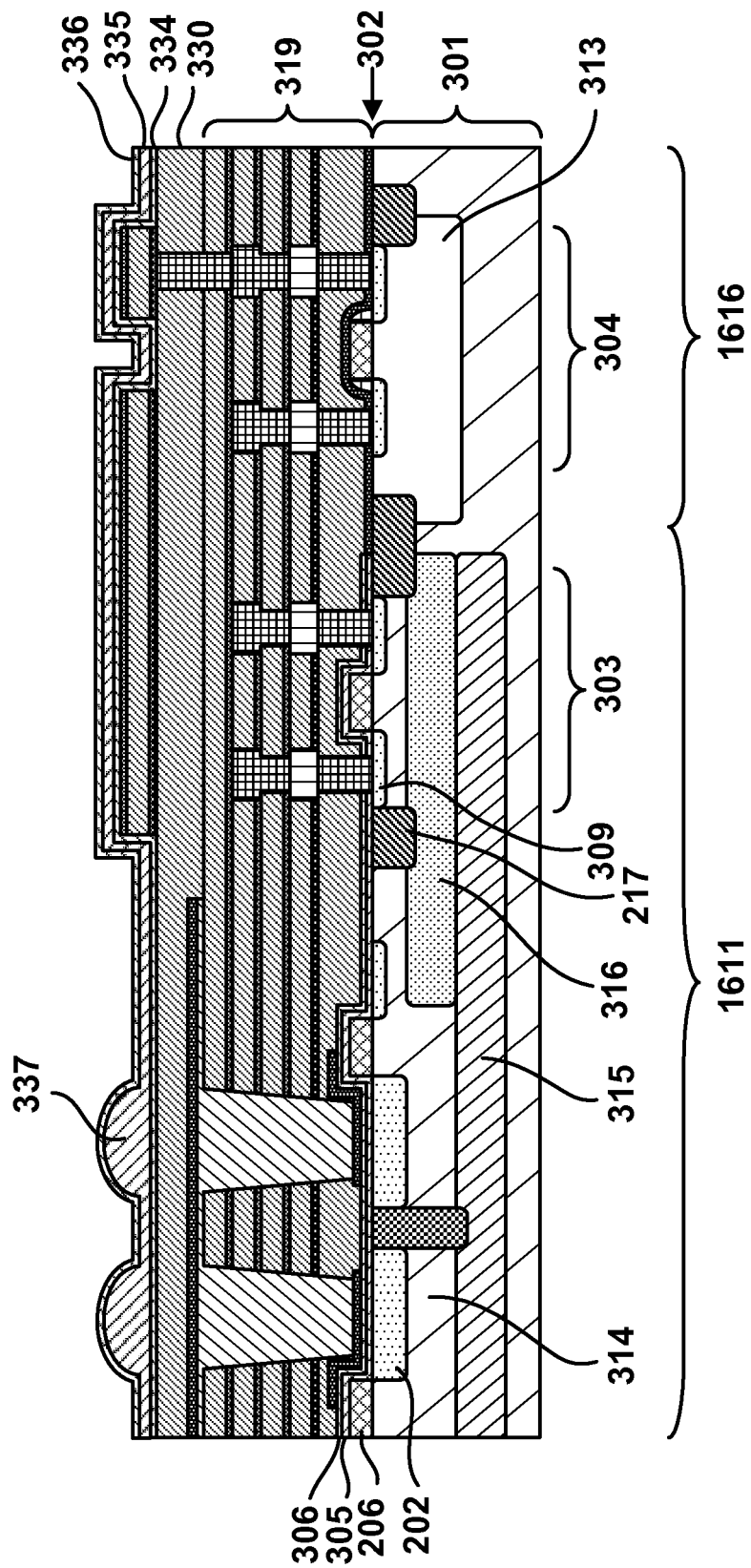
FIGS. 3A and 3B are views for explaining the solid-state image sensor according to the first embodiment of the present invention and the manufacturing method thereof.

Next, in a process shown in FIG. 3A, a first insulation film required to form an insulation film 334 and a second insulation film required to form an insulation film 335 are formed in this order. A lens-shaped photoresist pattern is formed on the second insulation film, and the second insulation film is etched using that pattern as a mask, thereby forming intra-layer lenses 337. After that, a third insulation film required to form an insulation film 336 on the lenses is formed. By removing the third insulation film of regions corresponding to pads such as input and output pads, the insulation film 336 is formed. In this case, the insulation film 335 is a lens layer having the intra-layer lenses 337, and the insulation films 334 and 336 can function as antireflection films of the insulation film 335.

Figure 3B:
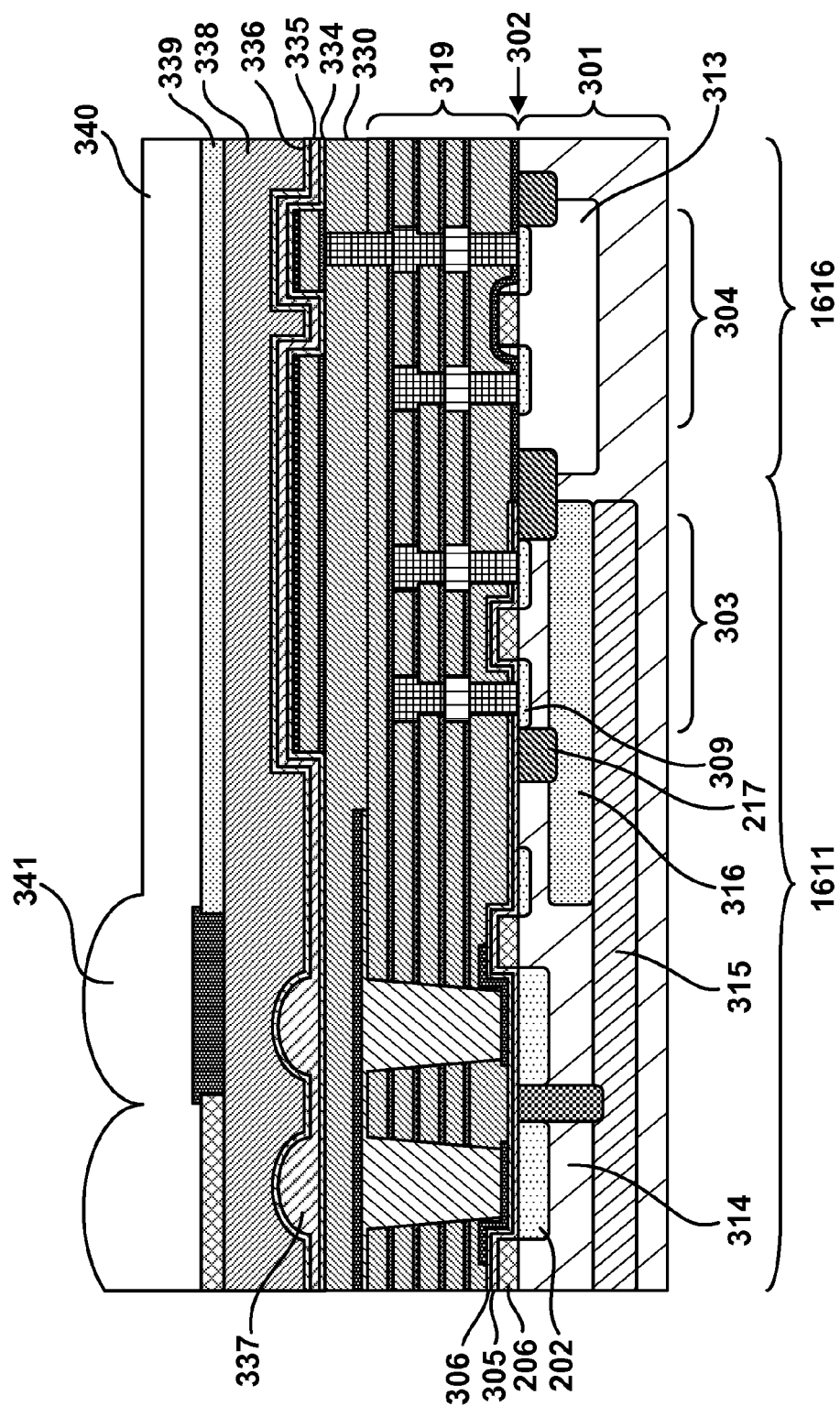

In a process shown in FIG. 3B, a resin planarization layer 338, a color filter layer 339 including color filers corresponding to a plurality of colors, and a microlens layer 340 including microlenses 341 are formed in this order.

Figure 4:
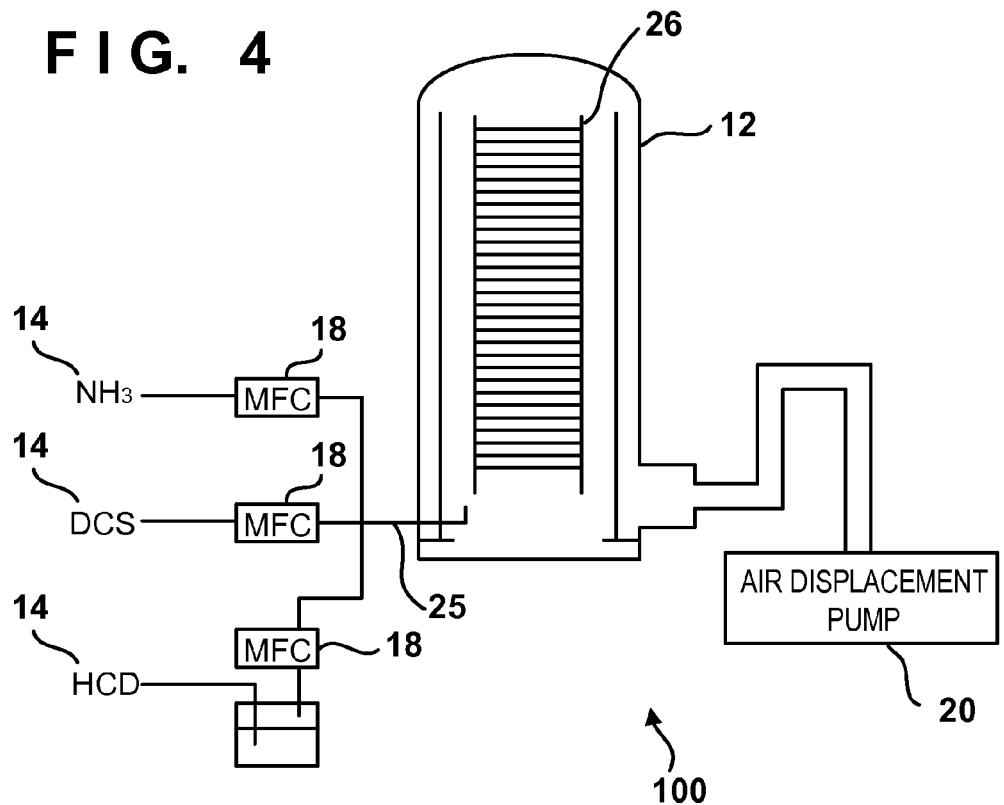
FIG. 4 is a view showing an example of the configuration of a low-pressure CVD apparatus.

In the aforementioned manufacturing method of the solid-state image sensor, at least one of the silicon nitride films 305 and 307 can be formed by the low-pressure CVD method using hexachlorodisilane (HCD) as a material gas, so as to cover at least a portion of each photoelectric conversion portion. The silicon nitride film formed by such method is called an HCD-SiN. The silicon nitride films 305 and 307 can be formed using, for example, a vapor deposition apparatus shown in FIG. 4. A vapor deposition apparatus 100 shown in FIG. 4 is a batch type low-pressure CVD apparatus. The vapor deposition apparatus 100 has a processing chamber 12 required to form a silicon nitride film on a semiconductor substrate. In the processing chamber 12, substrates held by boats 26 are located. The vapor deposition apparatus 100 includes a gas tube 25 used to introduce reaction gases 14 required to form a silicon nitride film, mass flow controllers (MFCs) 18 required to control flow ratios (or flow rates) of the reaction gases 14, and an air displacement pump 20 required to displace gases in the processing chamber 12. The vapor deposition apparatus 100 also has a control unit (not shown) required to control the flow ratios of the reaction gases 14 and the temperature and pressure inside the processing chamber 12.

In one example, the silicon nitride film 305 can be formed by the low-pressure CVD method using HCD as a reaction gas used to supply silicon and ammonia ($NH_3$) as a reaction gas used to supply nitrogen. More specifically, the internal pressure of the processing chamber 12 is reduced to a predetermined pressure within a range of 13.3 to 133 Pa (0.1 to 1.0 Torr). After that, the silicon nitride film 305 is grown under processing conditions of a gas flow ratio $HCD/NH_3$=about 10 to 100, a temperature of 600° C., and a film formation time of about 30 min. Then, an HCD-SiN having a thickness of about 50 nm can be formed as the silicon nitride film 305. Since the temperature is set to be around 600° C., the HCD-SiN can have a large hydrogen content while assuring a given film formation rate. The silicon nitride film 307 can also be formed under the same conditions as the silicon nitride film 305.

In this case, both of the silicon nitride films 305 and 307 need not be formed as an HCD-SiN, but at least one of the silicon nitride films 305 and 307 need only be formed as an HCD-SiN. For example, the silicon nitride film 305 can be formed as a DCS-SiN, and the silicon nitride film 307 can be formed as an HCD-SiN. Alternatively, the silicon nitride film 305 can be formed as an HCD-SiN, and the silicon nitride film 307 can be formed as a DCS-SiN.

Processes for forming the silicon nitride film 305 or 307 as a DCS-SiN will be exemplified below. The internal pressure of the processing chamber 12 is reduced to a predetermined pressure within a range of 13.3 to 133 Pa (0.1 to 1.0 Torr). After that, a silicon nitride film is grown using DCS and ammonia ($NH_3$) as reaction gases under processing conditions of a gas flow ratio $DCS/NH_3$=about 10/1 to 1, a temperature of 770° C., and a film formation time of about 20 min. Thus, a silicon nitride film (DCS-SiN) having a thickness of about 50 nm can be obtained.

Figure 5:
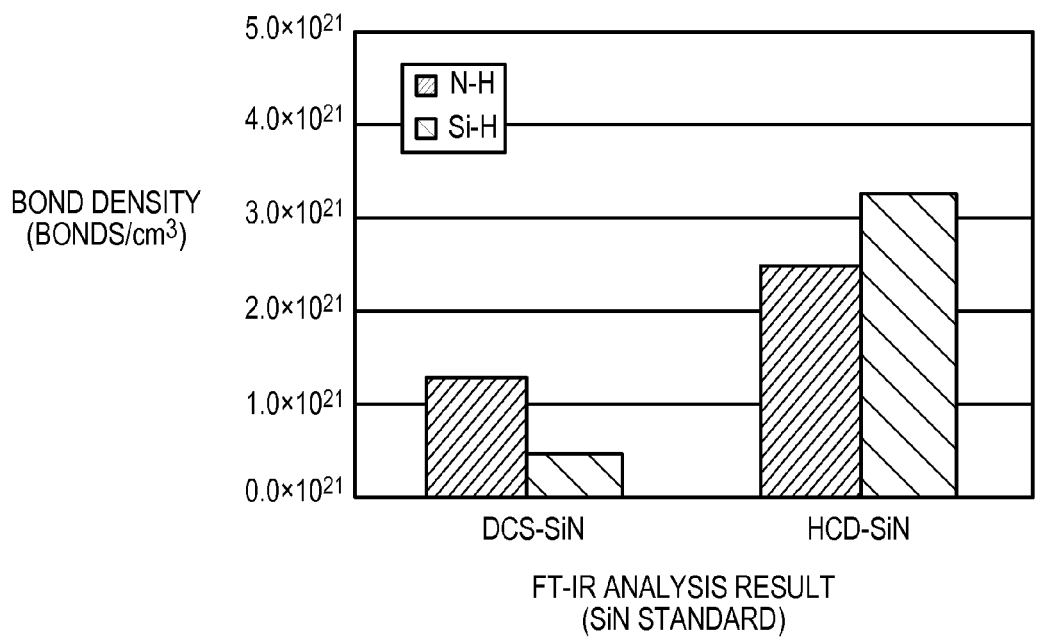
FIG. 5 is a graph showing the analysis results of Si—H and N—H bond densities in an HCD-SiN and DCS-SiN.

FIG. 5 shows the analysis results of the Fourier transform IR spectroscopy (to be referred to as FT-IR hereinafter). FIG. 5 shows N—H and Si—H bond densities of the HCD-SiN and DCS-SiN formed by the aforementioned methods. The film thicknesses of the HCD-SiN and DCS-SiN are respectively about 50 nm. As can be seen from FIG. 5, the HCD-SiN is a silicon nitride film which has the higher Si—H and N—H bond densities and a larger hydrogen content than the DCS-SiN. It is desirable that at least one of the Si—H and N—H bond densities is $1.5 \times 10^{21}$ atoms/$cm^3$ or more. According to the examinations of the present inventors, it is desirable that a silicon nitride film containing Si—H or N—H bonds at a density of $1.5 \times 10^{21}$ atoms/$cm^3$ or more covers a photoelectric conversion portion. Then, in annealing in a sintering process after wiring patterns are formed, left hydrogen effectively terminates dangling bonds of each photoelectric conversion portion, thus obtaining a low-noise solid-state image sensor. The density of Si—H bonds in the HCD-SiN is $3.3 \times 10^{21}$ atoms/$cm^3$, and the density of N—H bonds in the HCD-SiN is $2.5 \times 10^{21}$ atoms/$cm^3$. Both the densities exceed $1.5 \times 10^{21}$ atoms/$cm^3$ or more.

A solid-state image sensor according to the second embodiment of the present invention and a method thereof will be described below with reference to FIGS. 6A to 6C, FIGS. 7A to 7C, and FIGS. 8A and 8B. In the second embodiment, the silicon nitride film 317 is not left on the pixel portion 1611, and the silicon nitride film 305 is used as an etching stopper unlike in the first embodiment, and other points are common to the first embodiment.

Figure 6A:
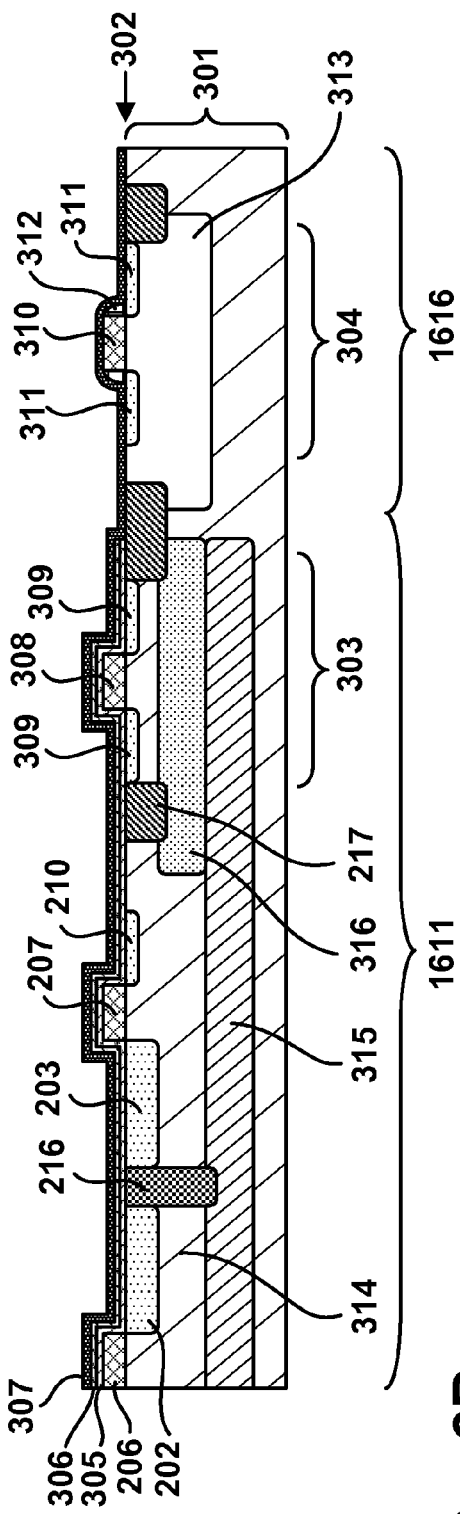
FIGS. 6A to 6C are views for explaining a solid-state image sensor according to the second embodiment of the present invention and a manufacturing method thereof.
Figure 6B:
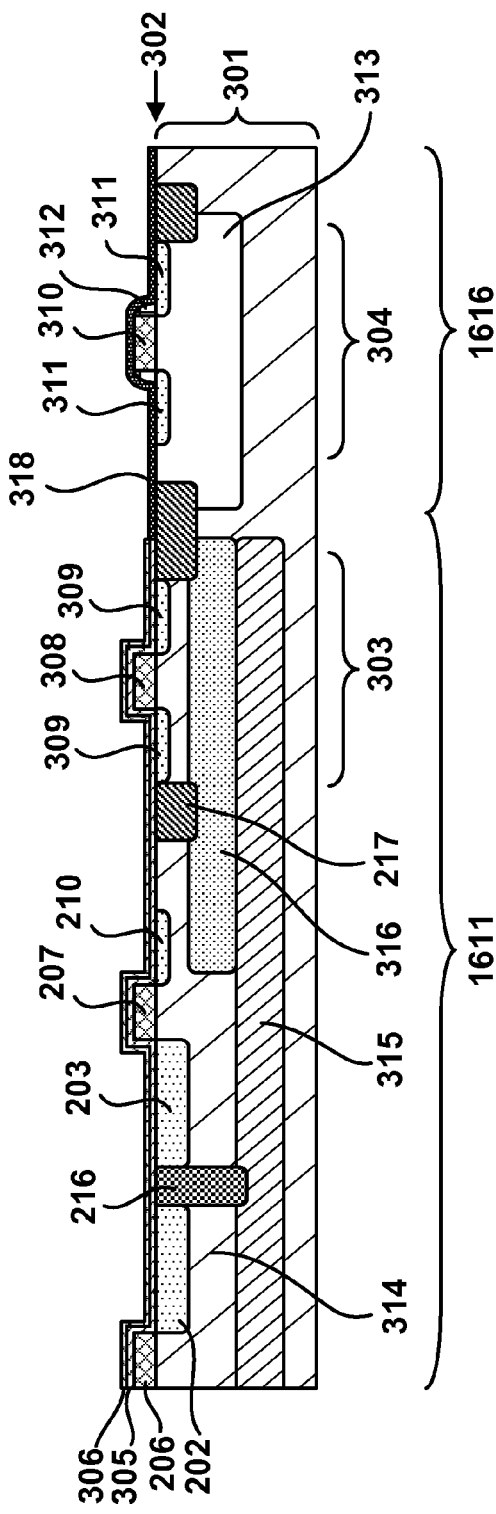

In a process shown in FIG. 6A, a structure shown in FIG. 6A is formed by the same method as that described with reference to FIG. 1A. However, in the second embodiment, a silicon nitride film 305 is formed as an HCD-SiN. Next, in a process shown in FIG. 6B, a silicon nitride film 307 formed on a pixel portion 1611 of the pixel portion 1611 and a peripheral circuit portion 1616 is removed to leave a silicon nitride film 318 on the peripheral circuit portion 1616.

Figure 6C:
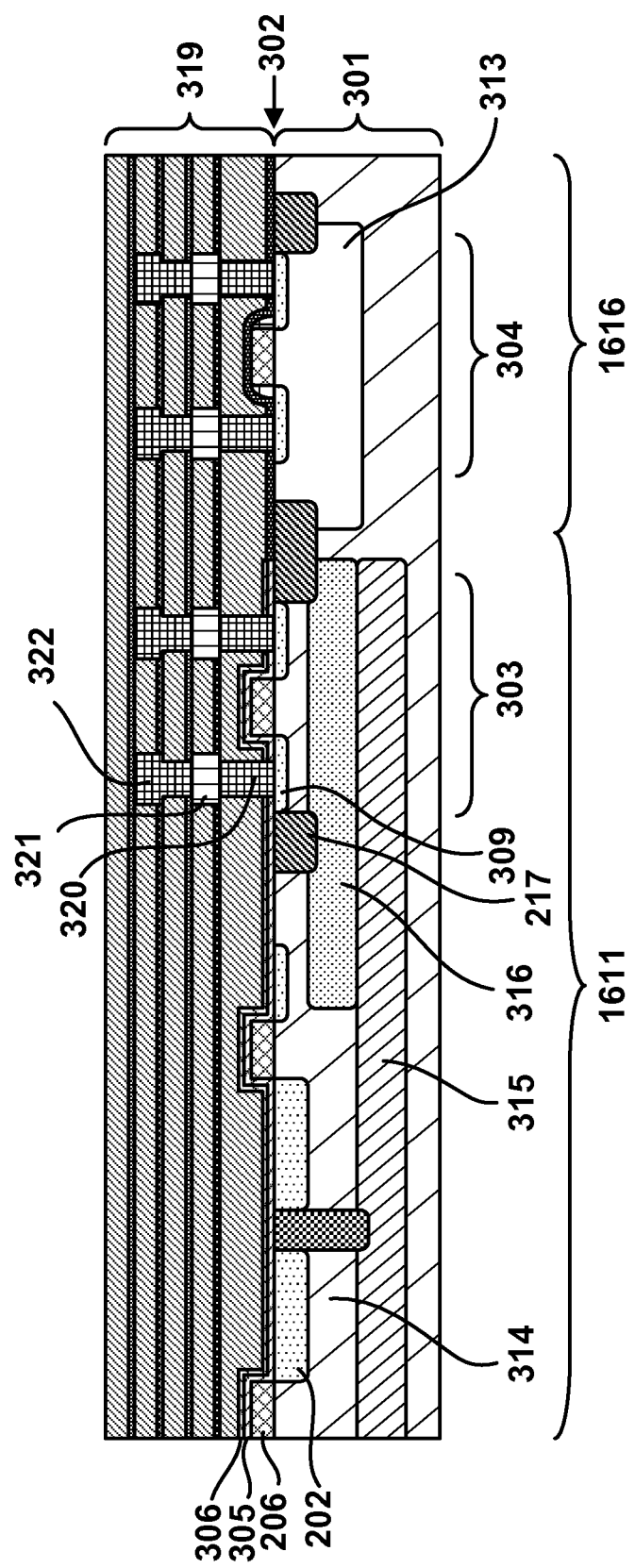

Next, in a process shown in FIG. 6C, a plurality of interlayer insulation films 319, contact plugs 320, first wiring layers 321, and second wiring layers 322 including a via plug can be formed. The plurality of interlayer insulation films 319 can be configured by alternately stacking silicon oxide films and silicon nitride films. The plurality of interlayer insulation films 319 can be used as claddings of lightguides. The first and second wiring layers 321 and 322 can be formed by a damascene method using, for example, a material containing copper as a principal component, but they may be formed using other materials such as aluminum.

Figure 7A:
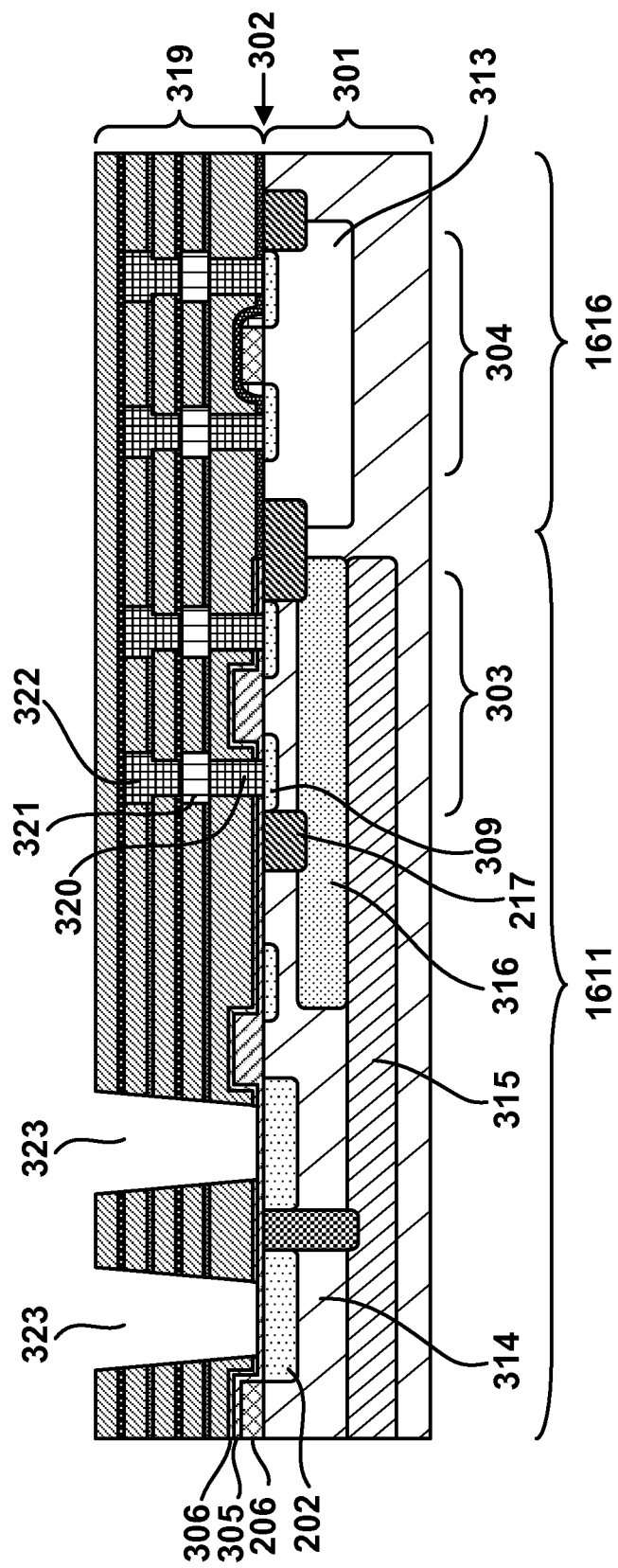
FIGS. 7A to 7C are views for explaining the solid-state image sensor according to the second embodiment of the present invention and the manufacturing method thereof.

Next, in a process shown in FIG. 7A, openings 323 are formed in the plurality of interlayer insulation films 319 and silicon nitride film 306. The openings 323 can be formed by forming a photoresist pattern (not shown) having openings in regions corresponding to the photoelectric conversion portions (n-type semiconductor regions 202 and 203), and etching the plurality of interlayer insulation films 319 using that pattern as a mask. This etching can be, for example, anisotropic etching. More specifically, plasma etching can be executed for the plurality of interlayer insulation films 319 and silicon nitride film 306 until the silicon nitride film 305 is exposed. The silicon nitride film 305 is a film required to reduce plasma damages on the photoelectric conversion portions (n-type semiconductor regions 202 and 203) at the time of etching, and also functions as an etching stop film.

Figure 7B:
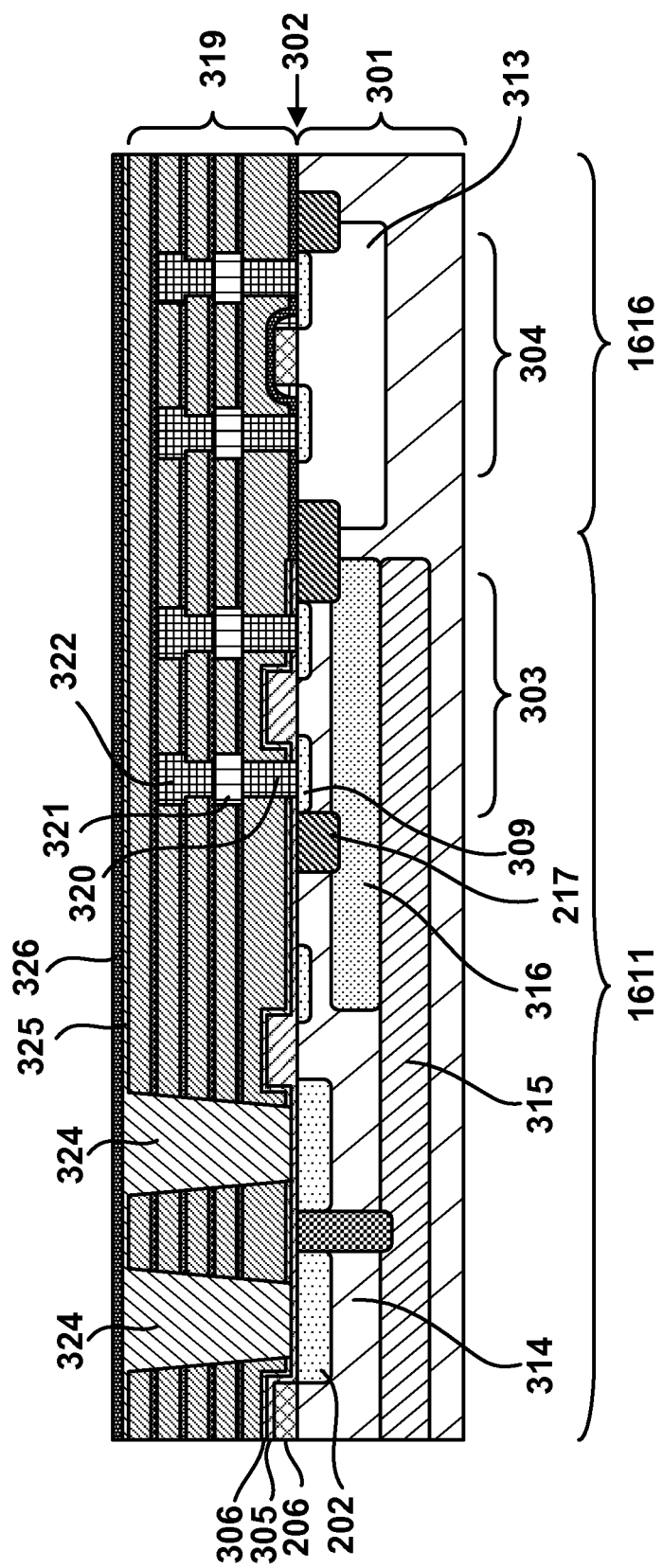

Next, in a process shown in FIG. 7B, a transparent material having a higher refractive index than the plurality of interlayer insulation films 319 serving as claddings fills the openings 323 to form portions used as cores of lightguides. In this case, silicon nitride having a higher refractive index than silicon oxide as a principal material of the plurality of interlayer insulation films 319 is formed in the openings 323. More specifically, silicon nitride (HCD-SiN) is deposited on the entire face by a low-pressure CVD method using HCD, thereby filling the openings 323 with silicon nitride 324. The silicon nitride formed on a portion other than the openings 323 can be removed by, for example, CMP or plasma etching. This process planarizes the face of the silicon nitride, thus forming a silicon nitride film 325.

Figure 7C:
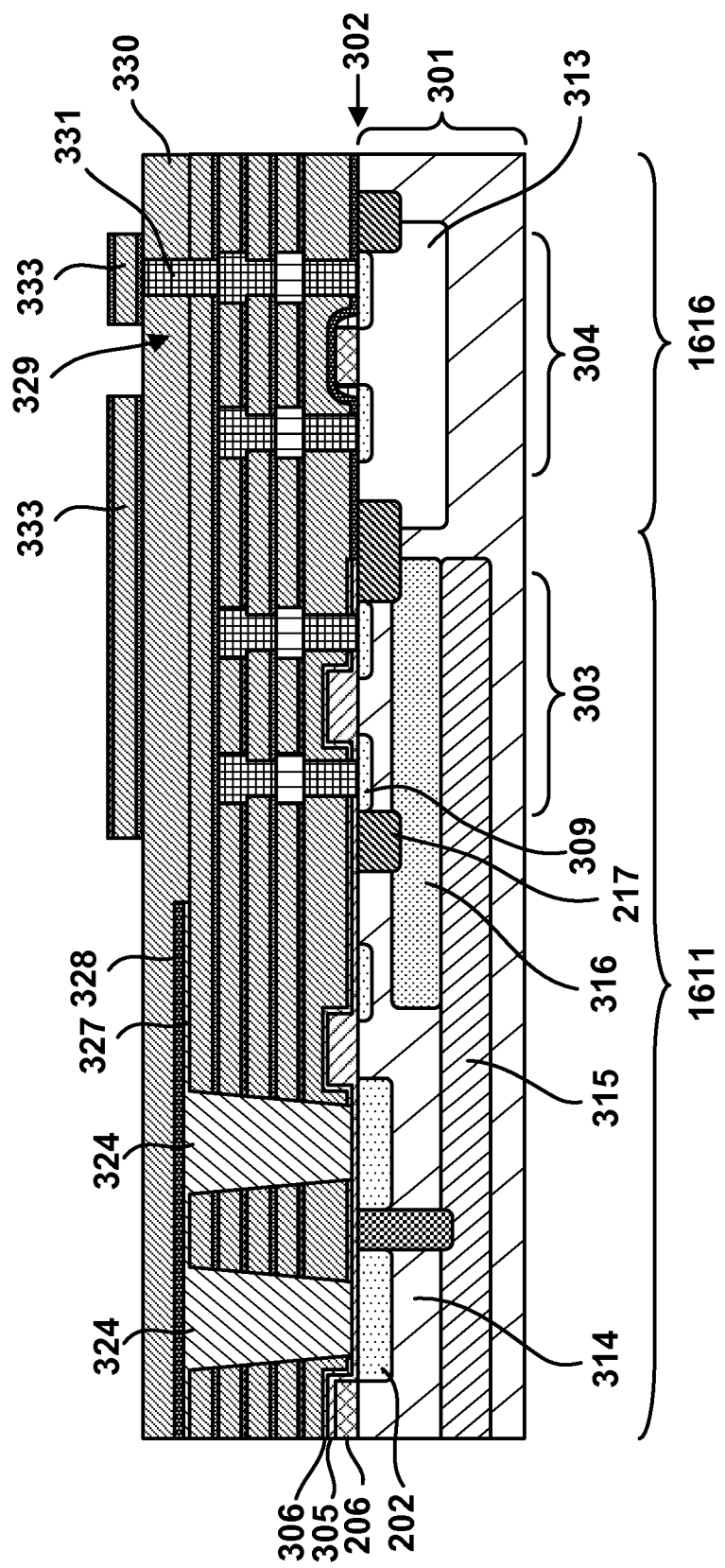
Figure 8A:
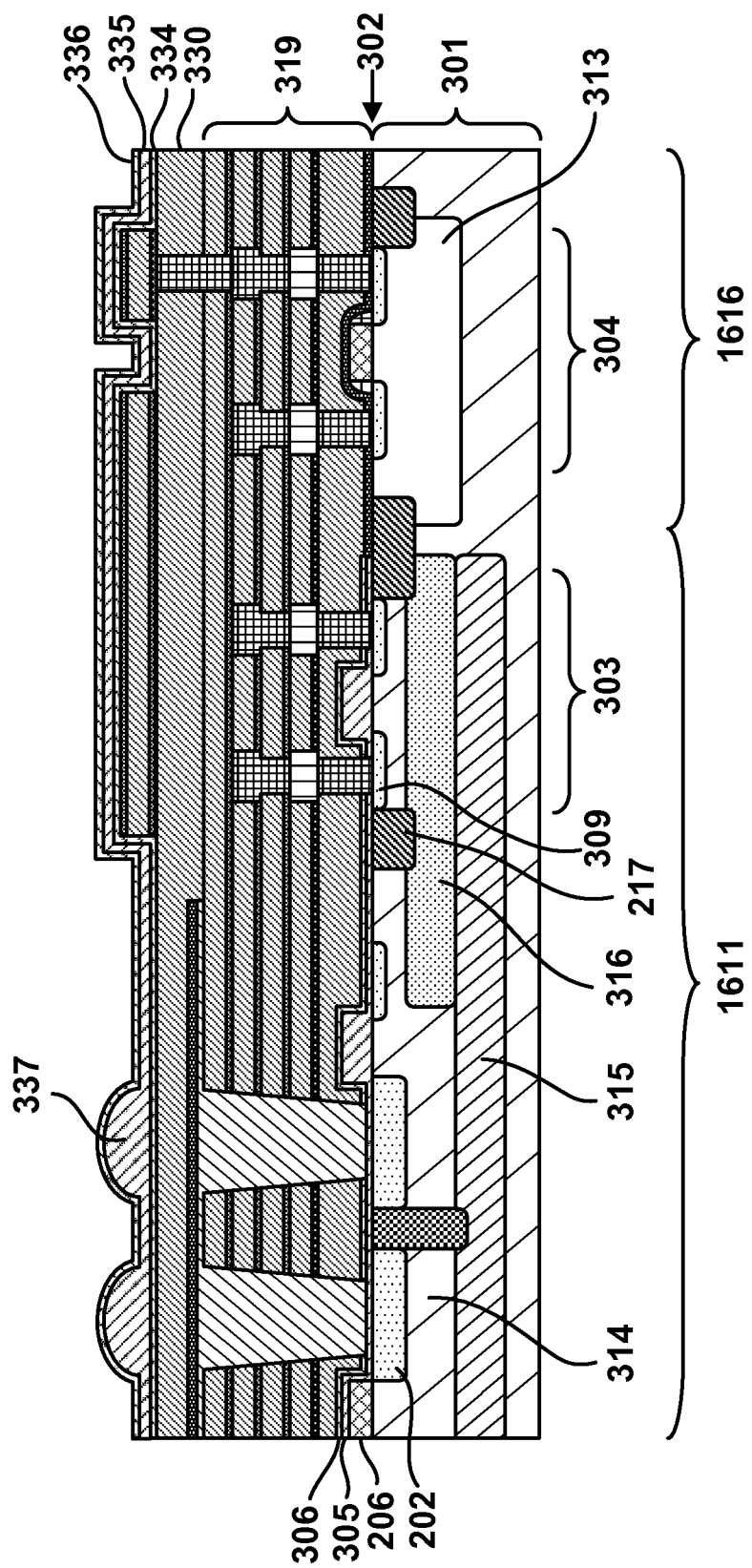
FIGS. 8A and 8B are views for explaining the solid-state image sensor according to the second embodiment of the present invention and the manufacturing method thereof.
Figure 8B:
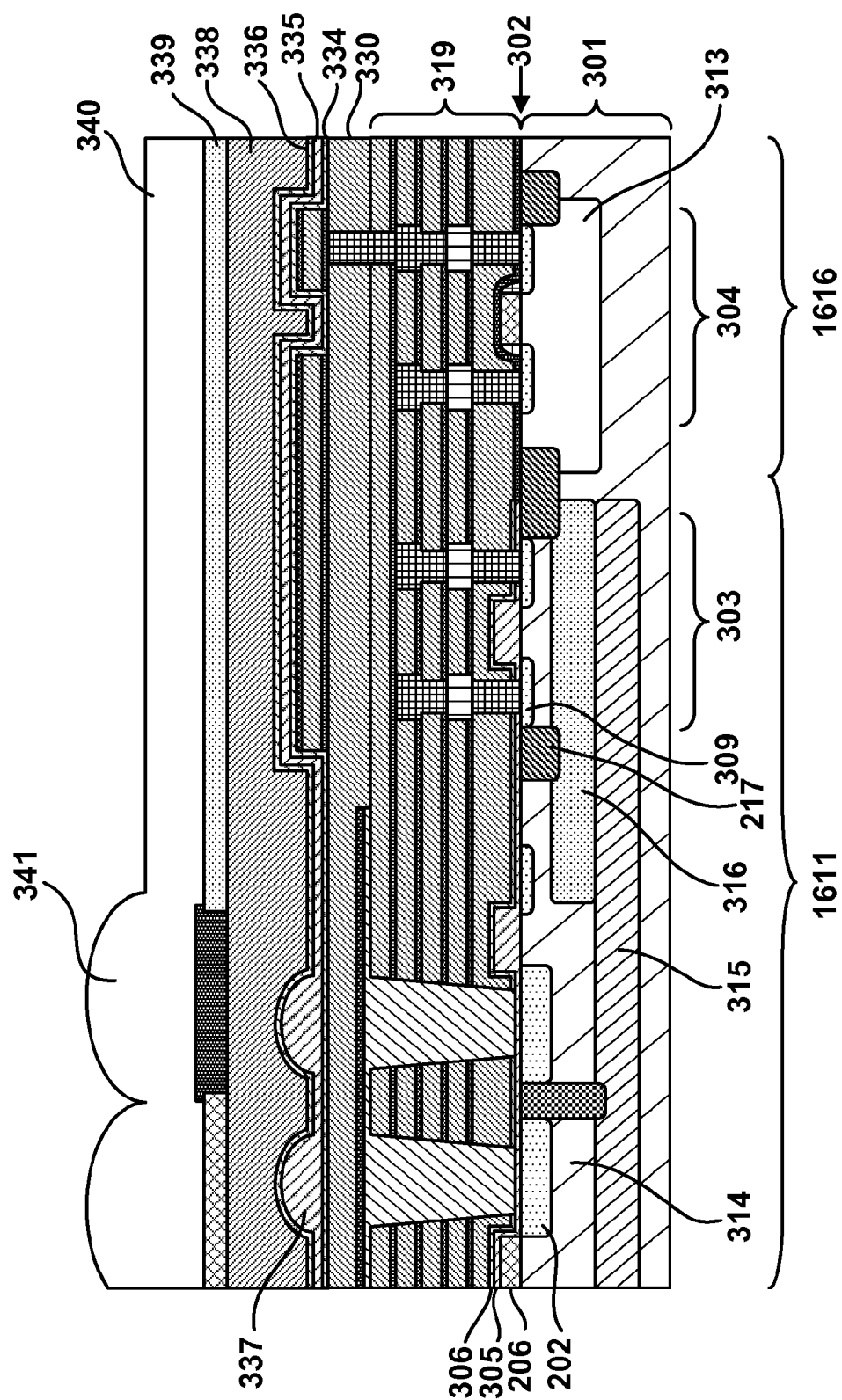

After that, in processes shown in FIGS. 7C, 8A, and 8B, a wiring layer 333, planarization layer 338, color filter layer 339, and microlens layer 340 including microlenses 341 are formed by the same methods as those in the processes shown in FIGS. 2C, 3A, and 3B.

In the second embodiment, the silicon nitride film 305 configured by the HCD-SiN is closer to the photoelectric conversion portions (n-type semiconductor regions 202 and 203) than the silicon nitride film 317 in the first embodiment. Hence, the silicon nitride film 305 in the second embodiment has a higher hydrogen supply performance to the photoelectric conversion portions than the silicon nitride film 317 in the first embodiment.

As an application example of the solid-state image sensor according to the above embodiments, a camera which incorporates the solid-state image sensor will be exemplified below. The concept of the camera includes not only an apparatus primarily intended to an image capturing operation, but also an apparatus which includes the image capturing function as an auxiliary function (for example, a personal computer and portable terminal). The camera includes the solid-state image sensor according to the present invention exemplified as the embodiments, and a processing unit which processes a signal output from the solid-state image sensor. The processing unit can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-222348, filed Oct. 6, 2011 which is hereby incorporated by reference herein in its entirety.

What is claimed is:

1. A method of manufacturing a solid-state image sensor having a photoelectric conversion portion, the method comprising:

forming a first silicon nitride film by a low-pressure chemical vapor deposition method using hexachlorodisilane ($Si_2Cl_6$) as a material gas such that the first silicon nitride film covers at least a part of the photoelectric conversion portion; and forming, after the forming the first silicon nitride film, a second silicon nitride by a plasma-enhanced chemical vapor deposition method.

2. The method according to claim 1, further comprising:
forming an interlayer insulation film on the first silicon nitride film; and
forming an opening in the interlayer insulation film,
wherein the forming the second silicon nitride is performed such that the opening is filled with the second silicon nitride, and
wherein the interlayer insulation film and the second silicon nitride form a lightguide for guiding light to the photoelectric conversion portion.

3. The method according to claim 2, wherein in the forming the opening in the interlayer insulation film, the opening is formed by etching the interlayer insulation film using, as an etching stopper, the first silicon nitride film.

4. The method according to claim 1, wherein the solid-state image sensor comprises a pixel portion including the photoelectric conversion portion and a peripheral circuit portion including a transistor, and
wherein, in the forming the first silicon nitride film, the first silicon nitride film is formed to cover at least the part of the photoelectric conversion portion and the transistor.

5. The method according to claim 1, further comprising:
before the forming the first silicon nitride film, forming a third silicon nitride film to cover at least a part of the photoelectric conversion portion,
wherein in the forming the first silicon nitride film, the first silicon nitride film is formed on the third silicon nitride film.

6. The method according to claim 5, wherein in the forming the third silicon nitride film, the third silicon nitride film is formed using hexachlorodisilane as a material gas.

7. The method according to claim 1, wherein the solid-state image sensor comprises a pixel portion including the photoelectric conversion portion and a peripheral circuit portion including a transistor, and
the method further comprises forming another silicon nitride film to cover the transistor.

8. The method according to claim 1, wherein in the forming the first silicon nitride film, the first silicon nitride film is formed to contain Si—H bonds and N—H bonds, so that a density of at least one of the Si—H bonds and the N—H bonds is not less than $1.5 \times 10^{21}$ atoms/cm$^3$.

9. The method according to claim 1, wherein the first silicon nitride film is formed so as to cover a gate electrode, and the method further comprises, before the forming the second silicon nitride, partially etching the first silicon nitride film such that side spacers are formed to cover side walls of the gate electrode.

10. The method according to claim 1, further comprising:
forming an interlayer insulation film on the first silicon nitride film; and
forming a contact hole in the interlayer insulation by etching the interlayer insulation using the first silicon nitride film as an etching stopper.

11. The method according to claim 1, wherein the first silicon film is formed such that an antireflection film is formed.

12. The method according to claim 1, further comprising, before the forming the first silicon nitride, forming one or more films, wherein the first silicon film is formed such that an antireflection film is formed.

13. A solid-state image sensor having a photoelectric conversion portion, the sensor comprising:

a first silicon nitride film located to cover at least a part of the photoelectric conversion portion, the first silicon nitride film being formed by a low-pressure chemical vapor deposition method using hexachlorodisilane as a material gas; and
a second silicon nitride formed by a plasma-enhanced chemical vapor deposition method and located above the first silicon nitride film.

14. The sensor according to claim 13, wherein the first silicon nitride film contains Si—H bonds and N—H bonds, and
a density of at least one of the Si—H bonds and the N—H bonds is not less than $1.5 \times 10^{21}$ atoms/cm$^3$.

15. A camera comprising:
a solid-state image sensor of claim 13; and
a processing unit which processes a signal output from said solid-state image sensor.

16. The sensor according to claim 13, further comprising a gate electrode and side spacers covering side walls of the gate electrode, wherein the side spacers include a silicon nitride formed by a low-pressure chemical vapor deposition method using hexachlorodisilane as a material gas.

17. The sensor according to claim 13, wherein the first silicon film serves as an antireflection film.

18. The sensor according to claim 13, further comprising, under the first silicon film, one or more film, wherein the first silicon film serves as an antireflection film.

19. A method of manufacturing a solid-state image sensor having a photoelectric conversion portion and a transistor, the method comprising:
forming a silicon nitride film by a low-pressure chemical vapor deposition method using hexachlorodisilane ($Si_2Cl_6$) as a material such that the silicon nitride film covers the photoelectric converter and the transistor; and
partially etching the silicon nitride film such that a silicon nitride film covering the photoelectric converter and side spacers covering side walls of a gate of the transistor are formed from the silicon nitride film.

20. A method of manufacturing a solid-state image sensor having a photoelectric conversion portion, the method comprising:
forming a silicon nitride film by a low-pressure chemical vapor deposition method using hexachlorodisilane ($Si_2Cl_6$) as a material gas such that the silicon nitride film covers at least a part of the photoelectric conversion portion;
forming an interlayer insulation film on the silicon nitride film; and
forming a contact hole in the interlayer insulation by etching the interlayer insulation using the silicon nitride film as an etching stopper.

21. A method of manufacturing a solid-state image sensor having a photoelectric conversion portion, the method comprising:
forming a silicon nitride film by a low-pressure chemical vapor deposition method using hexachlorodisilane ($Si_2Cl_6$) as a material gas such that the silicon nitride film covers at least a part of the photoelectric conversion portion;
forming an interlayer insulation film on the silicon nitride film;
forming an opening in the interlayer insulation film; and
filling the opening with silicon nitride,
wherein the interlayer insulation film and the silicon nitride filling the opening form a lightguide for guiding light to the photoelectric conversion portion.

* * * * *